US012787517B2

(12) United States Patent
Hsu et al.

(10) Patent No.: US 12,787,517 B2
(45) Date of Patent: Nov. 3, 2026

(54) TRANSPARENT DISPLAY DEVICE HAVING LIGHT-SHIELDING LAYER

(71) Applicant: AUO Corporation, Hsinchu (TW)

(72) Inventors: Jia Hao Hsu, Hsinchu (TW); YuTang Tsai, Hsinchu (TW); Kun-Cheng Tien, Hsinchu (TW); Wang-Shuo Kao, Hsinchu (TW)

(73) Assignee: AUO Corporation, Hsinchu (TW)

( * ) Notice: Subject to any disclaimer, the term of this patent is extended or adjusted under 35 U.S.C. 154(b) by 381 days.

(21) Appl. No.: 18/544,345

(22) Filed: Dec. 18, 2023

(65) Prior Publication Data

US 2025/0151482 A1 May 8, 2025

(30) Foreign Application Priority Data

Nov. 2, 2023 (TW) ................................ 112142167

(51) Int. Cl.
*H10H 20/855* (2025.01)
*H10W 90/00* (2026.01)

(52) U.S. Cl.
CPC .......... *H10H 20/855* (2025.01); *H10W 90/00* (2026.01)

(58) Field of Classification Search
CPC ............... H10H 20/855; H10H 29/857; H10H 29/8552; H10H 20/85; H10H 29/142; H10H 29/14; H10W 90/00; G09F 9/30
See application file for complete search history.

(56) References Cited

U.S. PATENT DOCUMENTS

| | | | | |
|---|---|---|---|---|
| 10,269,776 B2 * | 4/2019 | Lai | ........................ | H10H 20/841 |
| 10,312,472 B2 | 6/2019 | Chen et al. | | |
| 11,264,431 B2 * | 3/2022 | Zhang | .................. | H10K 59/121 |
| 2012/0138981 A1 * | 6/2012 | Chen | .................... | H10H 20/855<br>257/E33.056 |
| 2017/0229430 A1 * | 8/2017 | Lai | ........................ | H10H 20/841 |
| 2021/0233981 A1 * | 7/2021 | Chen | .................... | H10K 50/828 |
| 2022/0384683 A1 * | 12/2022 | Lee | ...................... | H10H 20/831 |
| 2023/0028201 A1 | 1/2023 | Heber et al. | | |
| 2023/0030854 A1 * | 2/2023 | Lee | ........................ | H10K 59/40 |
| 2023/0033385 A1 * | 2/2023 | Park | ...................... | G06F 3/0412 |

(Continued)

FOREIGN PATENT DOCUMENTS

| | | |
|---|---|---|
| CN | 111048691 | 4/2020 |
| CN | 211349383 | 8/2020 |

(Continued)

*Primary Examiner* — Caleb E Henry
(74) *Attorney, Agent, or Firm* — JCIPRNET

(57) ABSTRACT

A transparent display device includes a driving backplane, a light-emitting element, a first planarization layer, a first light-shielding layer, a second planarization layer and a second light-shielding layer. The light-emitting element is disposed on the driving backplane. The first planarization layer covers the light-emitting element. The first light-shielding layer is disposed on the first planarization layer and has a first opening. The first opening at least partially overlaps the light-emitting element. The second planarization layer covers the first light-shielding layer. The second light-shielding layer is disposed on the second planarization layer and has a second opening. The second opening at least partially overlaps the first opening.

20 Claims, 9 Drawing Sheets

(56) References Cited

U.S. PATENT DOCUMENTS

| | | | | |
|---|---|---|---|---|
| 2023/0110159 | A1* | 4/2023 | Chan | H10H 20/856 257/89 |
| 2023/0185391 | A1* | 6/2023 | Im | G06F 3/0418 345/174 |
| 2023/0207751 | A1* | 6/2023 | Wang | H10H 20/853 257/79 |
| 2023/0209882 | A1* | 6/2023 | Ko | H10K 50/86 257/40 |
| 2023/0209965 | A1* | 6/2023 | Yun | H10K 59/351 345/173 |
| 2025/0204098 | A1* | 6/2025 | Hsu | H10H 20/84 |

FOREIGN PATENT DOCUMENTS

| | | |
|---|---|---|
| CN | 108107623 | 11/2020 |
| CN | 216354278 | 4/2022 |
| CN | 114981718 | 8/2022 |

* cited by examiner

TRANSPARENT DISPLAY DEVICE HAVING LIGHT-SHIELDING LAYER

CROSS-REFERENCE TO RELATED APPLICATION

This application claims the priority benefit of Taiwan application serial no. 112142167, filed on Nov. 2, 2023. The entirety of the above-mentioned patent application is hereby incorporated by reference herein and made a part of this specification.

BACKGROUND

Technical Field

The present disclosure relates to a display device, and in particular to a transparent display device.

Description of Related Art

A transparent display device refers to a display device which is able to provide a transparent display state for users to view the scene behind it, such transparent display device is commonly found in showcases, vending machines, etc. The transparent display device has a display area and a transparent area. The display area may provide a display screen for the user to view, and the transparent area is transparent so that the user is able to view the scene behind the display device. Pixels are provided in the display area to emit image beams toward the display surface of the transparent display device to provide screens. However, part of the image beam will be reflected back into the transparent display device at the interface between the display surface and the outer environment, and then pass through the rear surface of the transparent display device, which causes a backside light leakage problem.

SUMMARY

The present disclosure provides a transparent display device that is able to improve the problem of backside light leakage.

A transparent display device includes a driving backplane, a light-emitting element, a first planarization layer, a first light-shielding layer, a second planarization layer, a second light-shielding layer, a molding substrate and an optical clear adhesion. The light-emitting element is disposed on the driving backplane and electrically connected to the driving backplane. The first planarization layer is disposed on the driving backplane and covers the light-emitting element. The first light-shielding layer is disposed on the first planarization layer and has a first opening. The first opening at least partially overlaps the light-emitting element. The second planarization layer covers the first light-shielding layer. The second light-shielding layer is disposed on the second planarization layer and has a second opening. The second opening at least partially overlaps the first opening. The molding substrate is disposed on the second light-shielding layer. The optical clear adhesion is disposed between the molding substrate and the second light-shielding layer.

DESCRIPTION OF THE EMBODIMENTS

Figure 2:
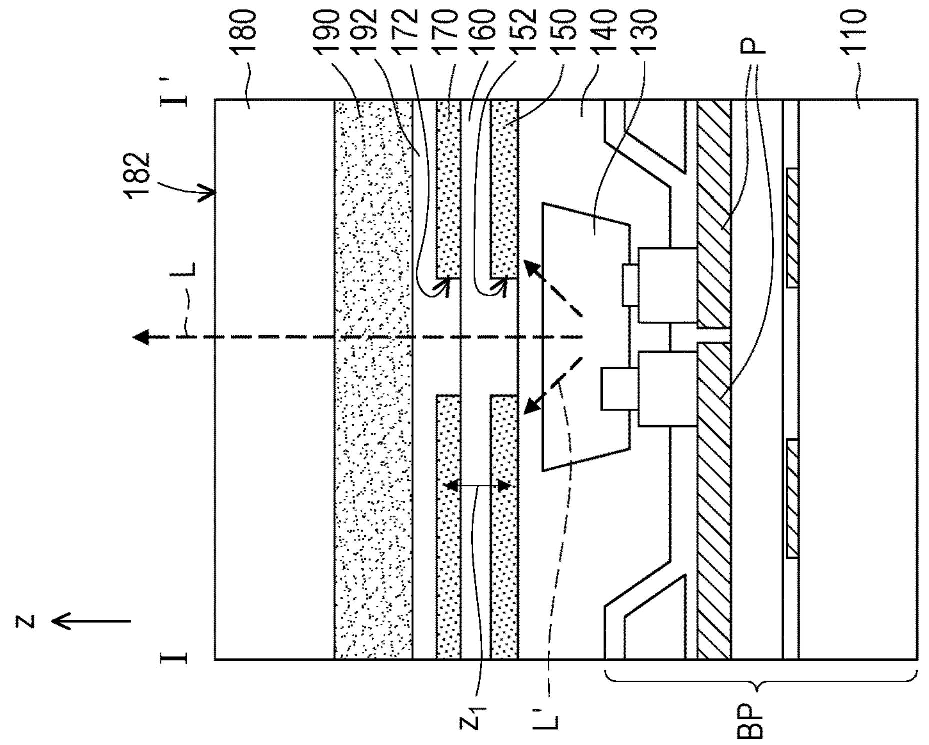
FIG. 2 is a schematic cross-sectional view of a transparent display device according to an embodiment of the present disclosure.

Reference will now be made in detail to the exemplary embodiments of the present disclosure, examples of which are illustrated in the accompanying drawings. Whenever possible, the same reference numbers are used in the drawings and descriptions to refer to the same or similar parts.

It should be understood that when a device such as a layer, film, region or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, the term "connected" may refer to physical connection and/or electrical connection. Besides, if two devices are "electrically connected" or "coupled", it is possible that other devices are present between these two devices.

The term "about," "approximately," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system) or the limitations of the manufacturing system. For instance, "about" may mean within one or more standard deviations, or within, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1:
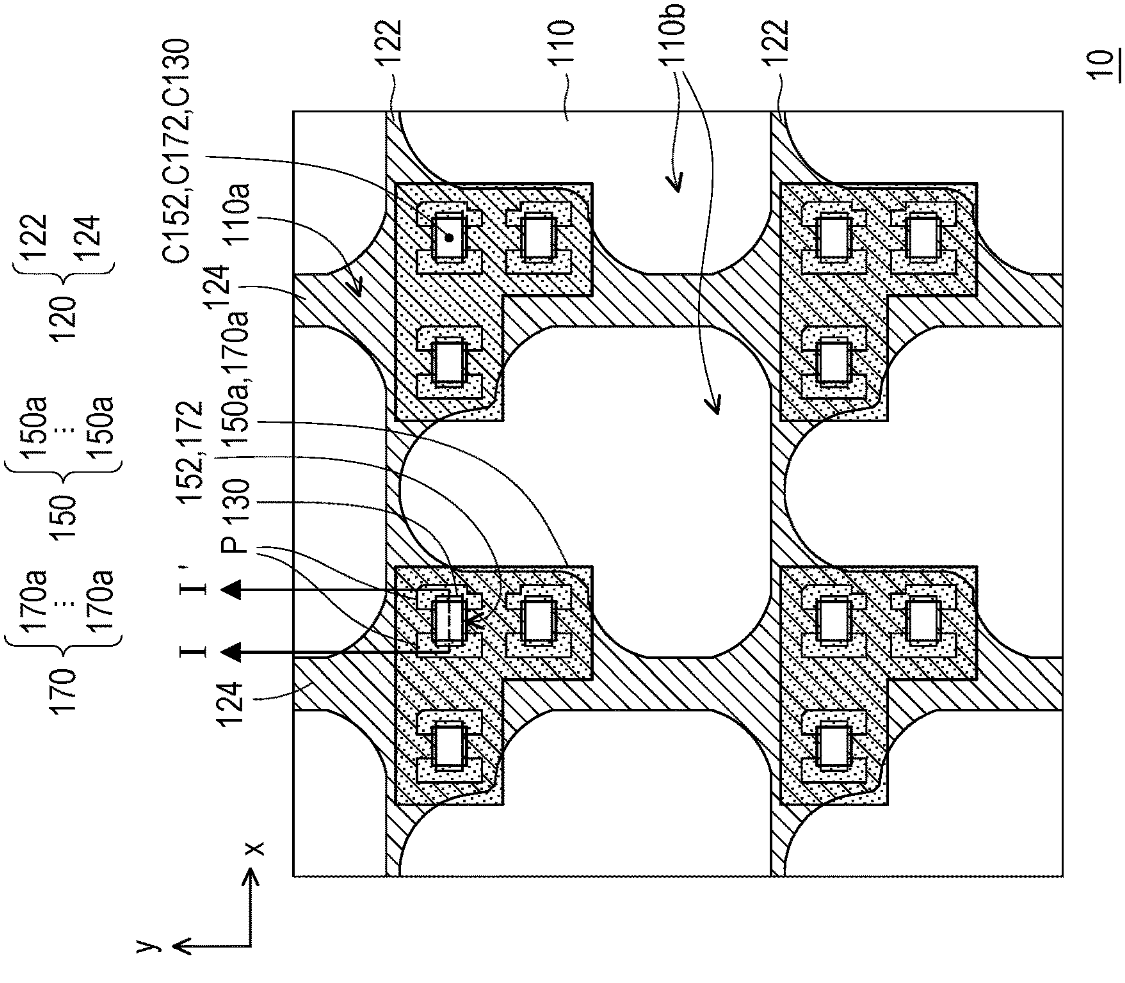
FIG. 1 is a schematic top view of a transparent display device according to an embodiment of the present disclosure.

FIG. 1 is a schematic top view of a transparent display device according to an embodiment of the present disclosure. FIG. 2 is a schematic cross-sectional view of a transparent display device according to an embodiment of the present disclosure. FIG. 2 corresponds to the section line I-I' of FIG. 1.

Please refer to FIG. 1 and FIG. 2. The transparent display device 10 includes a driving backplane BP. The driving backplane BP includes a transparent substrate 110 and a circuit structure 120. The transparent substrate 110 has a circuit area 110*a* and a plurality of transparent areas 110*b*. The circuit structure 120 is disposed in the circuit area 110*a* of the transparent substrate 110 and is substantially non-transparent. The plurality of transparent areas 110*b* are multiple areas of the transparent substrate 110 that are not occupied by the circuit structure 120. The circuit structure 120 includes a plurality of horizontal signal lines (not shown), a plurality of vertical signal lines (not shown), and a plurality of pixel driving circuits (not shown) electrically connected to the plurality of horizontal signal lines and the plurality of vertical signal lines. In this embodiment, each pixel driving circuit has a pad group P.

For example, in this embodiment, in the top view of the transparent display device 10, the circuit structure 120 is generally a mesh structure, and the mesh structure includes a plurality of horizontal portions 122 and a plurality of vertical portions 124 staggered with each other. The plurality of horizontal portions 122 have the plurality of horizontal signal lines, the plurality of vertical portions 124 have the plurality of vertical signal lines, and the plurality of pad groups P of the plurality of pixel driving circuits are generally located at multiple intersections of the plurality of horizontal portions 122 and the plurality of vertical portions 124, the plurality of transparent areas 110*b* of the transparent substrate 110 respectively overlap with multiple meshes of the mesh structure, but the disclosure is not limited thereto.

The transparent display device 10 further includes a plurality of light-emitting elements 130, which are disposed on the driving backplane BP and are electrically connected to the driving backplane BP. Specifically, each light-emitting element 130 is electrically connected to a corresponding pad group P of a pixel driving circuit. In this embodiment, the light-emitting element 130 is, for example, a micro light-emitting diode (μLED), but the disclosure is not limited thereto.

The transparent display device 10 further includes a first planarization layer 140, which is disposed on the driving backplane BP and covers the light-emitting element 130. The first planarization layer 140 is light-transmissive. In this embodiment, the material of the first planarization layer 140 may be an inorganic material (such as silicon oxide, silicon nitride, silicon oxynitride, or a stacked layer of at least two of the above materials), an organic material, or a combination thereof.

The transparent display device 10 further includes a first light-shielding layer 150, which is disposed on the first planarization layer 140 and has a first opening 152, wherein the first opening 152 at least partially overlaps the light-emitting element 130. For example, in this embodiment, the first light-shielding layer 150 may include a plurality of first light-shielding patterns 150*a*, and the plurality of first light-shielding patterns 150*a* may be disposed at multiple intersections of the plurality of horizontal portions 122 and the plurality of vertical portions 124 of the circuit structure 120 without occupying the transparent area 110*b* or occupying very little portion of the transparent area 110*b*. Each first light-shielding pattern 150*a* may have a plurality of first openings 152 respectively overlapping the plurality of light-emitting elements 130 of the same pixel. In this embodiment, the material of the first light-shielding layer 150 is, for example, blackened metal. However, the present disclosure is not limited thereto. In other embodiments, the material of the first light-shielding layer 150 may also be other light-absorbing/light-blocking materials.

The transparent display device 10 further includes a second planarization layer 160 covering the first light-shielding layer 150. The second planarization layer 160 is light-transmissive. In this embodiment, the material of the second planarization layer 160 may be an inorganic material (such as silicon oxide, silicon nitride, silicon oxynitride, or a stacked layer of at least two of the above materials), an organic material, or a combination thereof.

The transparent display device 10 further includes a second light-shielding layer 170, which is disposed on the second planarization layer 160 and has a second opening 172, wherein the second opening 172 at least partially overlaps the first opening 152. For example, in this embodiment, the second light-shielding layer 170 may include a plurality of second light-shielding patterns 170*a*, and the plurality of second light-shielding patterns 170*a* may be respectively disposed above the plurality of first light-shielding patterns 150*a*. Each second light-shielding pattern 170*a* may have a plurality of second openings 172, and the plurality of second openings 172 of each second light-shielding pattern 170*a* respectively overlap with the plurality of first openings 152 of a corresponding first light-shielding pattern 150*a*. In this embodiment, the material of the second light-shielding layer 170 is, for example, blackened metal. However, the present disclosure is not limited thereto. In other embodiments, the material of the second light-shielding layer 170 may also be other light-absorbing/light-blocking materials.

The transparent display device 10 further includes a molding substrate 180 disposed on the second light-shielding layer 170. In this embodiment, the material of the molding substrate 180 is, for example, glass, quartz, or other applicable materials. The transparent display device 10 further includes an optical clear adhesion 190 disposed between the molding substrate 180 and the second light-shielding layer 170. In this embodiment, the transparent display device 10 further includes a molding layer 192. The molding layer 192 covers the second light-shielding layer 170, and the molding substrate 180 is fixed to the molding layer 192 through the optical clear adhesion 190.

The first light-shielding layer 150 and the second light-shielding layer 170 have first openings 152 and second openings 172 that at least partially overlap the light-emitting element 130. The light beam L emitted by the light-emitting element 130 is able to pass through the first light-shielding layer 150 and the second light-shielding layer 170 to further provide a display screen to the user located on the front side of the transparent display device 10. It is worth mentioning that the entity of the first light-shielding layer 150 and the entity of the second light-shielding layer 170 are able to block the light beam L' emitted by the light-emitting element 130 at a wide viewing angle, thereby preventing the light beam L' from being transmitted to the interface 182 between the molding substrate 180 and the ambient air 182. The light beam L' emitted at the wide viewing angle is less likely to be reflected on the interface 182 and then reflected to the rear side of the transparent display device 10. In this way, it is possible to suppress the light leakage from the rear side of the transparent display device 10. In addition, the first opening 152 of the first light-shielding layer 150 and the second opening 172 of the second light-shielding layer 170 also have the effect of narrowing the viewing angle.

Figure 4:
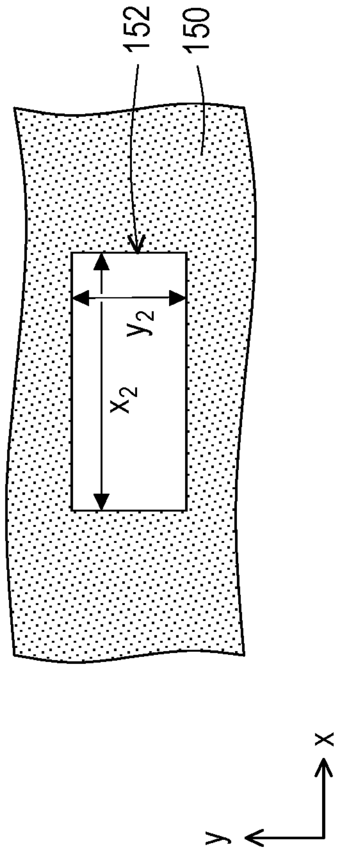
FIG. 4 is a schematic top view of the first opening of the first light-shielding layer according to an embodiment of the present disclosure.
Figure 3:
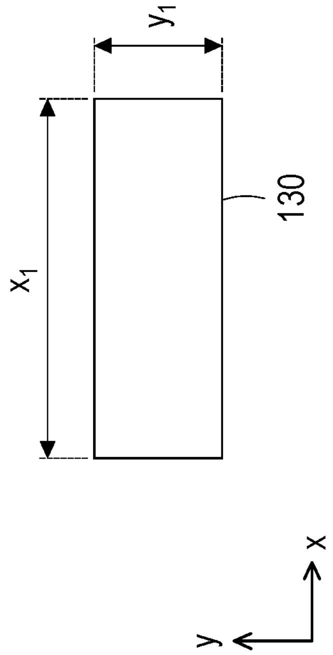
FIG. 3 is a schematic top view of a light-emitting element according to an embodiment of the present disclosure.

FIG. 3 is a schematic top view of a light-emitting element according to an embodiment of the present disclosure. FIG. 4 is a schematic top view of the first opening of the first light-shielding layer according to an embodiment of the present disclosure. Please refer to FIG. 1, FIG. 2, FIG. 3 and FIG. 4. The first direction x and the second direction y are substantially parallel to the driving backplane BP and perpendicular to each other. The third direction z is substantially perpendicular to the driving backplane BP, the first direction x and the second direction y. The first opening 152 has a first opening width $x_2$ and a second opening width $y_2$ respectively in the first direction x and the second direction y. The first opening width $x_2$ and the second opening width $y_2$ are set within an appropriate range, so that both light extraction efficiency and backside light leakage suppression effect can be taken into consideration.

For example, in this embodiment, the first opening width $x_2$ and the second opening width $y_2$ of the first opening 152 of the first light-shielding layer 150 may respectively satisfy:

$$\frac{x_1}{2} < x_2 < \frac{3x_1}{2} \text{ and } \frac{y_1}{2} < y_2 < \frac{3y_1}{2},$$

wherein $x_1$ is a width of the first light-emitting element of the light-emitting element 130 in the first direction x, $y_1$ is a width of the second light-emitting element of the light-emitting element 130 in the second direction y, but the present disclosure is not limited thereto.

The first light-shielding layer 150 and the second light-shielding layer 170 have a vertical distance $z_1$ in the third direction z. The larger the vertical distance $z_1$ is, the smaller the viewing angle of the transparent display device 10 will be and the less backside light leakage will be. The vertical distance $z_1$ is set to be an appropriate value, so that both the viewing angle and backside light leakage suppression effect can be taken into consideration. For example, in this embodiment, the vertical distance $z_1$ may satisfy: 5 $\mu m < z_1 < 30$ μm, but the disclosure is not limited thereto.

Please refer to FIG. 1. In this embodiment, in the top view of the transparent display device 10, the geometric center C152 of the first opening 152 of the first light-shielding layer 150 and the geometric center C172 of the second opening 172 of the second light-shielding layer 170 may be selectively and substantially aligned with the geometric center C130 of the light-emitting element 130, but the present disclosure is not limited thereto. Please refer to FIG. 1 and FIG. 2, in this embodiment, the first opening 152 of the first light-shielding layer 150 may be substantially aligned with the second opening 172 of the second light-shielding layer 170. That is to say, the first opening 152 of the first light-shielding layer 150 and the second opening 172 of the second light-shielding layer 170 may substantially overlap each other, but the present disclosure is not limited thereto.

It must be noted here that the following embodiments adopt the reference numbers and part of the contents of the previous embodiments, where the same numbers are used to represent the same or similar components, and the description of the same technical content is omitted. For descriptions of omitted parts, reference may be made to the foregoing embodiments and will not be repeated in the following embodiments.

Figure 6:
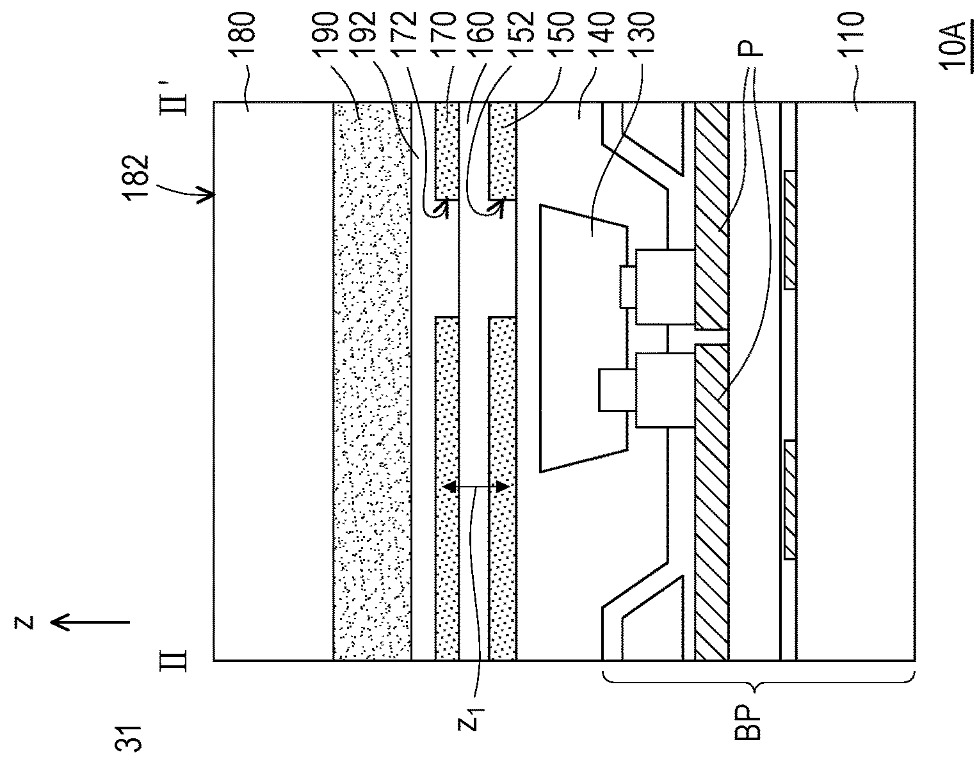
FIG. 6 is a schematic cross-sectional view of a transparent display device according to another embodiment of the present disclosure.
Figure 5:
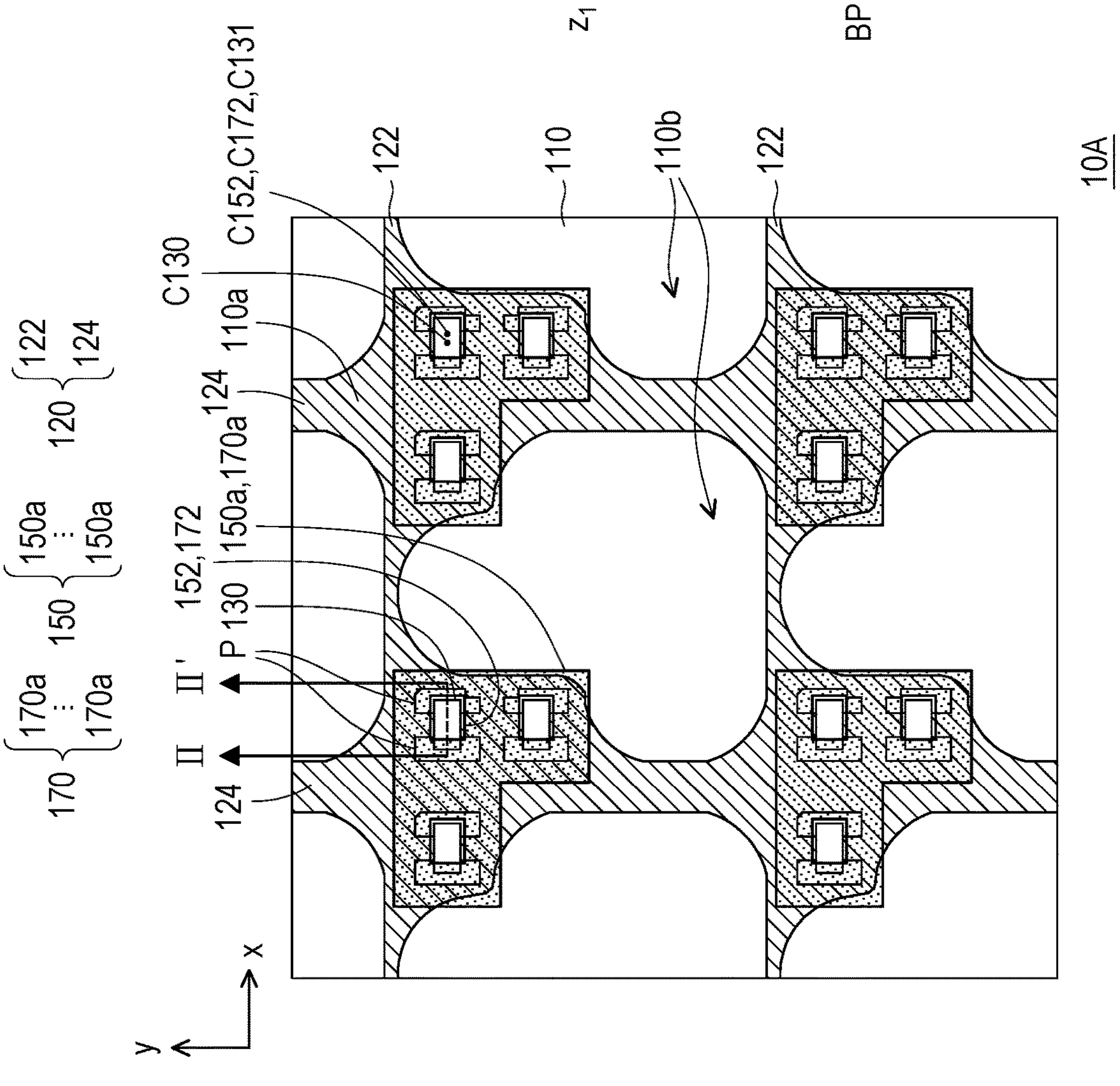
FIG. 5 is a schematic top view of a transparent display device according to another embodiment of the present disclosure.

FIG. 5 is a schematic top view of a transparent display device according to another embodiment of the present disclosure. FIG. 6 is a schematic cross-sectional view of a transparent display device according to another embodiment of the present disclosure. FIG. 6 corresponds to the section line II-II' of FIG. 5.

Please refer to FIG. 5 and FIG. 6. The transparent display device 10A of this embodiment is similar to the aforementioned transparent display device 10. The difference between the two is that the relative positions of the first opening 152/the second opening 172 of the transparent display device 10A and the light-emitting element 130 are different from the relative positions of the first opening 152/second opening 172 of the transparent display device 10 and the light-emitting element 130. In this embodiment, in the top view of the transparent display device 10A, the geometric center C152 of the first opening 152 of the first light-shielding layer 150 and the geometric center C172 of the second opening 172 of the second light-shielding layer 170 may selectively not be aligned with the geometric center C130 of the light-emitting element 130.

Figure 7:
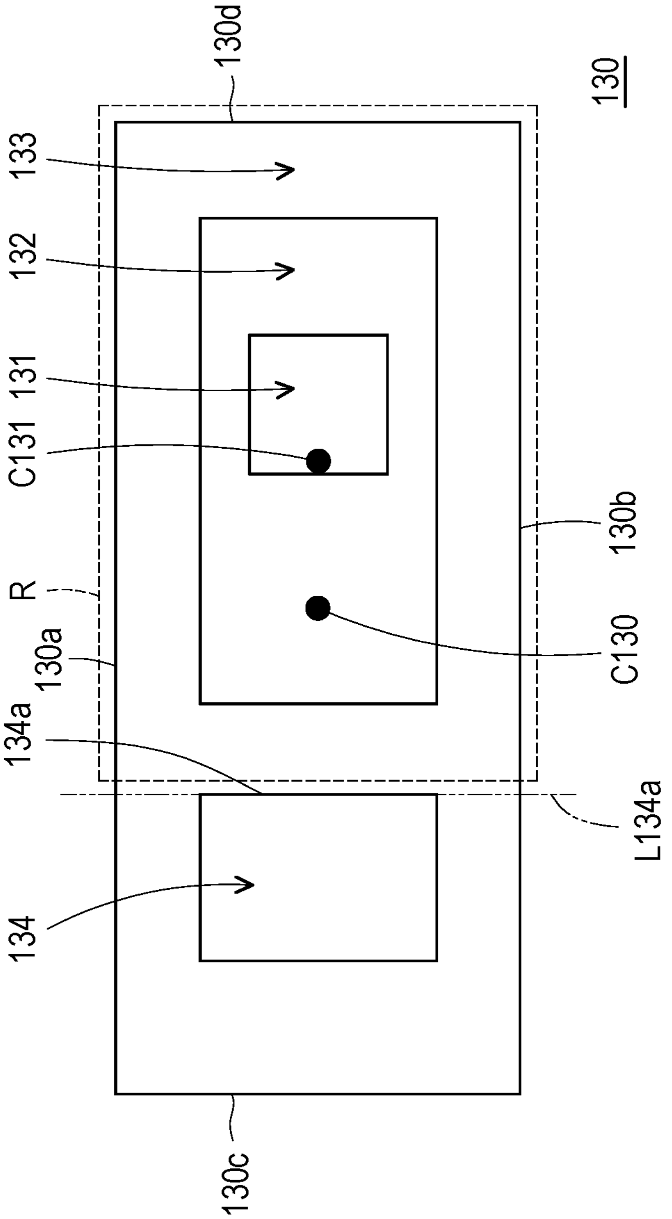
FIG. 7 is a schematic top view of a light-emitting element according to another embodiment of the present disclosure.

FIG. 7 is a schematic top view of a light-emitting element according to another embodiment of the present disclosure. Please refer to FIG. 5, FIG. 6 and FIG. 7. In this embodiment, in the top view of the transparent display device 10A, the geometric center C152 of the first opening 152 of the first light-shielding layer 150 is substantially aligned with a luminous center C131 of the light-emitting element 130, and the light-emitting element 130 has the maximum luminous intensity at the position of the luminous center C131. For example, in this embodiment, the light-emitting element 130 has a first area 131, a second area 132 surrounding the first area 131, a third area 133 surrounding the second area 132, and a fourth area 134. The fourth area 134 is located next to the second area 132 and surrounded by the third area 133, the luminous intensity of the first area 131 is greater than the luminous intensity of the second area 132, the luminous intensity of the second area 132 is greater than the luminous intensity of the third area 133, and the fourth area 134 overlaps one of the electrodes (not shown) of the light-emitting element 130. The luminous intensity of the fourth area 134 is substantially 0, and the luminous center C131 of the light-emitting element 130 may fall in the first area 131. The light-emitting element 130 has a plurality of edges 130*a*, 130*b*, 130*c*, and 130*d*. The edge 130*a* and the edge 130*b* are disposed opposite to each other, the edge 130*c* is connected between the edge 130*a* and the edge 130*b*, and the edge 130*d* is connected between the edge 130*a* and the edge 130*b* and is disposed opposite to the edge 130*c*. The fourth area 134 is close to the edge 130*c* and away from the edge 130*d*. The fourth area 134 has an edge 134*a* close to the edge 130*d*. The edge 134*a* is located on a quasi-line L134*a*. The quasi-line L134*a*, a partial edge 130*a* of the light-emitting element 130, a partial edge 130*b* of the light-emitting element 130, and a partial edge 130*d* of the light-emitting element 130 enclose a main luminous range R, and the luminous center C131 of the light-emitting element 130 may be the geometric center of the main luminous range R.

In this embodiment, the luminous center C131 of the light-emitting element 130 deviates from the geometric center C130 of the light-emitting element 130, and the first opening 152 of the first light-shielding layer 150 and the second opening 172 of the second light-shielding layer 170 may deviate along with the luminous center C131 of the light-emitting element 130. In this way, the viewing angle asymmetry of the transparent display device 10A may be alleviated, and the light extraction efficiency may be improved.

Figure 9:
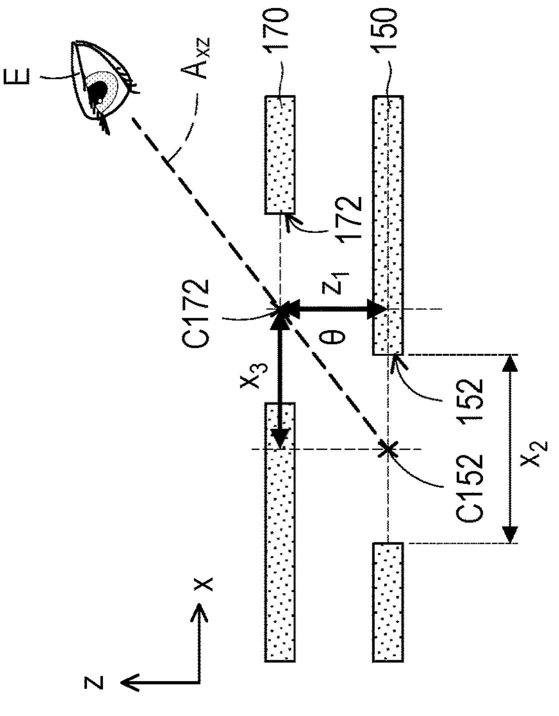
FIG. 9 is a cross-sectional and enlarged schematic view of the first light-shielding layer and the second light-shielding layer of a transparent display device according to yet another embodiment of the present disclosure.
Figure 10:
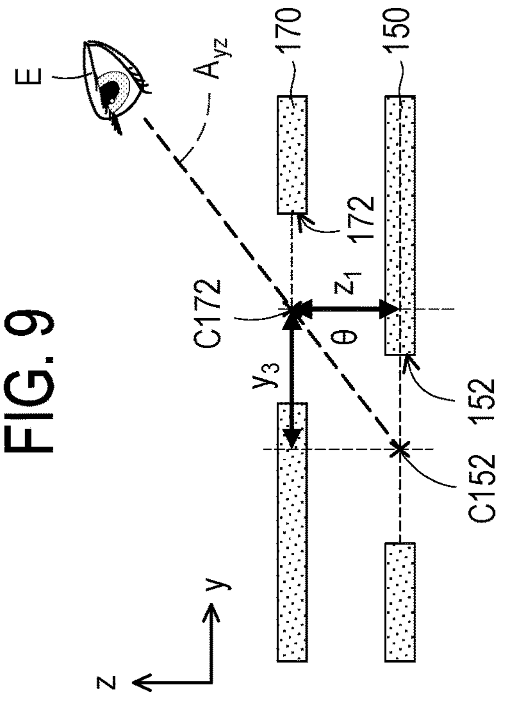
FIG. 10 is a cross-sectional and enlarged schematic view of the first light-shielding layer and the second light-shielding layer of a transparent display device according to still another embodiment of the present disclosure.
Figure 8:
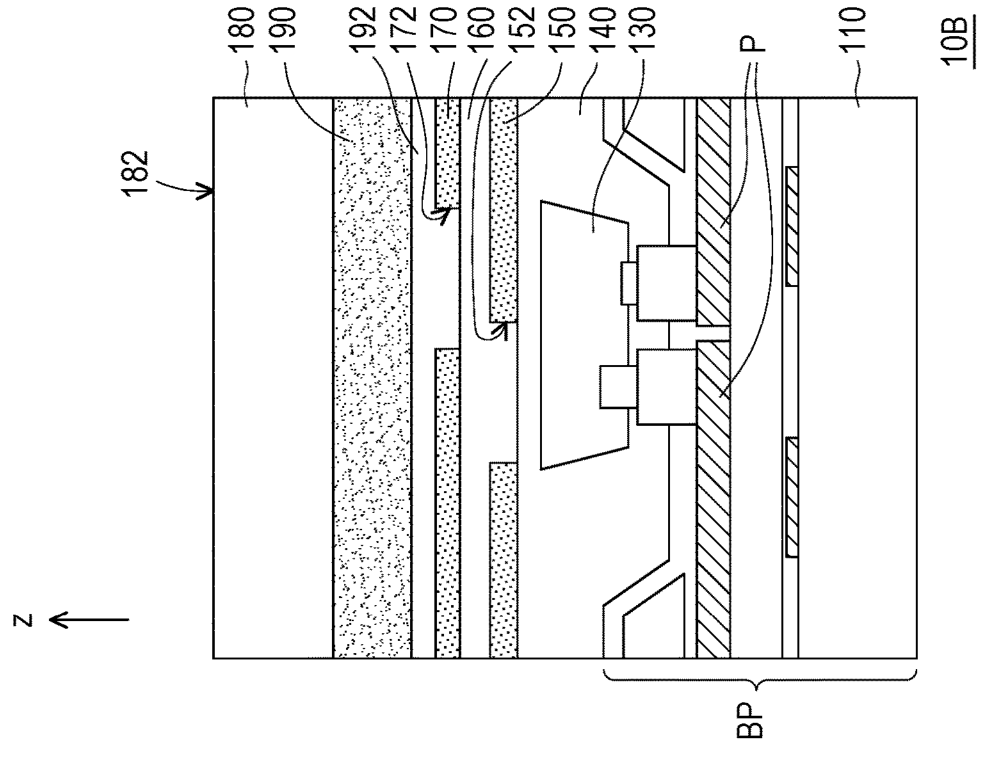
FIG. 8 is a schematic cross-sectional view of a transparent display device according to still another embodiment of the present disclosure.

FIG. 8 is a schematic cross-sectional view of a transparent display device according to still another embodiment of the present disclosure. FIG. 9 is a cross-sectional and enlarged schematic view of the first light-shielding layer and the second light-shielding layer of a transparent display device according to yet another embodiment of the present disclosure. FIG. 10 is a cross-sectional and enlarged schematic view of the first light-shielding layer and the second light-shielding layer of a transparent display device according to still another embodiment of the present disclosure. In particular, FIG. 9 shows a cross-section of the first light-shielding layer 150 and the second light-shielding layer 170 on a plane where the first direction x and the third direction z are located, and FIG. 10 shows a cross-section of the first light-shielding layer 150 and the second light-shielding layer 170 on a plane where the second direction y and the third direction z are located.

Please refer to FIG. 8, FIG. 9 and FIG. 10. The transparent display device 10B of this embodiment is similar to the aforementioned transparent display device 10. The difference between the two is that in this embodiment, the first opening 152 of the first light-shielding layer 150 and the second opening 172 of the second light-shielding layer 170 are not aligned with each other.

Please refer to FIG. 8, FIG. 9 and FIG. 10. Specifically, in this embodiment, the first opening 152 of the first light-shielding layer 150 and the second opening 172 of the second light-shielding layer 170 are staggered with each other, and the first opening 152 of the first light-shielding layer 150 partially overlaps the second opening 172 of the second light-shielding layer 170. The geometric center C152 of the first opening 152 and the geometric center C172 of the second opening 172 have a first offset $x_3$ and/or a second offset $y_3$ in the first direction x and/or the second direction y.

Specifically, in this embodiment, $$\tan\theta_x = \frac{x_3}{z_1},$$

the optimal viewing angle in the first direction x is $$\theta_x = \tan^{-1}\left(\frac{x_3}{z_1}\right), \tan\theta_y = \frac{y_3}{z_1},$$

the optimal viewing angle in the second direction y is $$\theta_y = \tan^{-1}\left(\frac{y_3}{z_1}\right),$$

wherein the $z_1$ is the vertical distance $z_1$ between the first light-shielding layer 150 and the second light-shielding layer 170 in the third direction z that is substantially perpendicular to the driving backplane BP. $x_3$ is the first offset in the first direction x between the geometric center C152 of the first opening 152 and the geometric center C172 of the second opening 172, and $y_3$ is the second offset in the second direction y between the geometric center C152 of the first opening 152 and the geometric center C172 of the second opening 172. By changing the first offset $x_3$ and/or the second offset to $y_3$, the optimal viewing angle $\theta_x$ and/or the optimal viewing angle $\theta_y$ may be obtained in the first direction x and/or the second direction y.

According to $$\theta_x = \tan^{-1}\left(\frac{x_3}{z_1}\right) \text{ and/or } \theta_y = \tan^{-1}\left(\frac{y_3}{z_1}\right),$$

the first offset $x_3$ and/or the second offset of the first opening 152 of the first light-shielding layer 150 and the second opening 172 of the second light-shielding layer 170 in the first direction x and/or the second direction y may be designed to be $y_3$ according to the optimal viewing angle $\theta_x$ and/or the optimal viewing angle $\theta_y$ to be achieved in the first direction x and/or the second direction y.

Please refer to FIG. 8 and FIG. 9. For example, in this embodiment, the first offset $x_3$ in the first direction x between the geometric center C152 of the first opening 152 and the geometric center C172 of the second opening 172 may satisfy:

$$z_1 \times \tan\theta_x - \frac{x_2}{2} < x_3 < z_1 \times \tan\theta_x + \frac{x_2}{2}, \quad \text{Relationship expression (1)}$$

wherein $z_1$ is the vertical distance between the first light-shielding layer 150 and the second light-shielding layer 170 in the third direction z, $\theta_x$ is an angle between a vertical projection $A_{xz}$ of a connection line between the geometric center C152 of the first opening 152 and a user's eye E on the plane where the first direction x and the third direction z are located and a third direction z perpendicular to the driving backplane BP (that is, the optimal viewing angle $\theta_x$ in the first direction x), and $x_2$ is a first opening width of the first opening 152 in the first direction x.

Please refer to FIG. 8 and FIG. 10. For example, in this embodiment, there may be a second offset $y_3$ between the geometric center C152 of the first opening 152 and the geometric center C172 of the second opening 172 in the second direction y, and the second offset $y_3$ may satisfy:

$$z_1 \times \tan\theta_y - \frac{y_2}{2} < y_3 < z_1 \times \tan\theta_y + \frac{y_2}{2}, \quad \text{Relationship expression (2)}$$

wherein $z_1$ is the vertical distance between the first light-shielding layer 150 and the second light-shielding layer 170 in the third direction z, $\theta_y$ is an angle between a vertical projection $A_{yz}$ of a connection line between the geometric center C152 of the first opening 152 and a user's eye E on the plane where the second direction y and the third direction z are located and the third direction z (that is, the optimal viewing angle $\theta_y$ in the second direction y), and $y_2$ is a second opening width of the first opening 152 in the second direction y.

Figure 12:
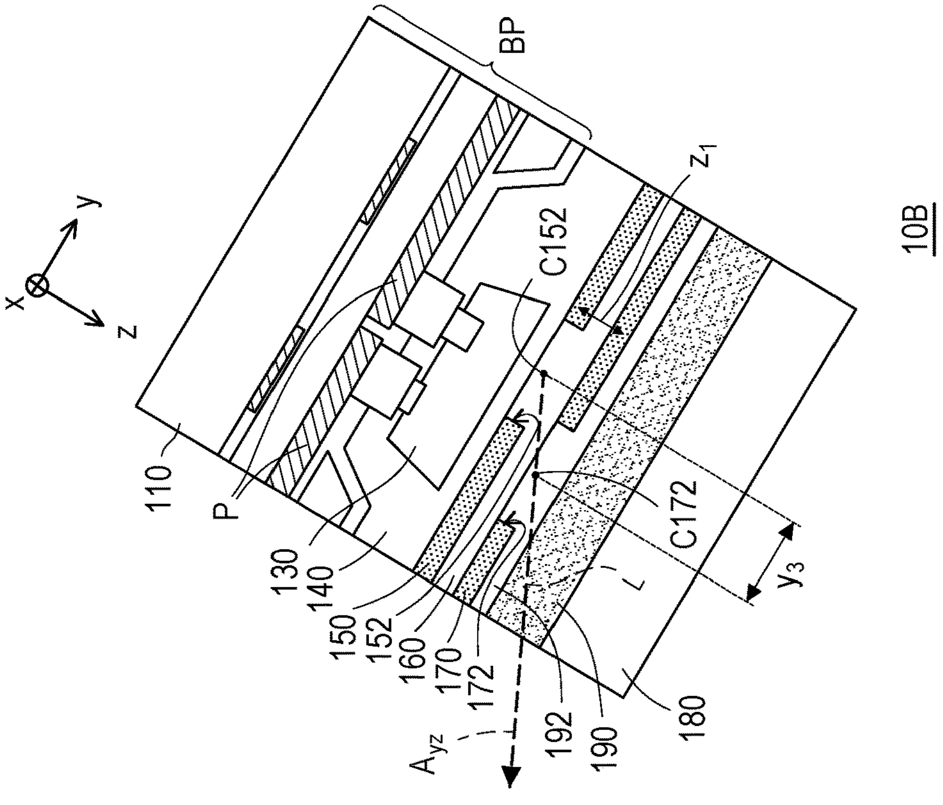
FIG. 12 is a cross-sectional and enlarged schematic view of the transparent display device of FIG. 11.
Figure 11:
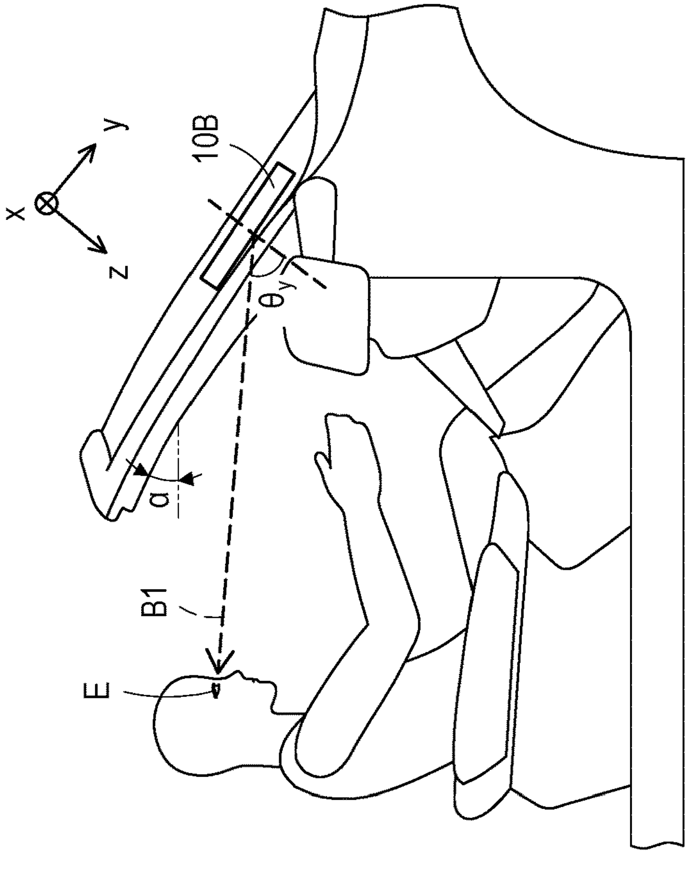
FIG. 11 shows a situation in which a transparent display device according to another embodiment of the present disclosure is applied to a front windshield.

FIG. 11 shows a situation in which a transparent display device according to another embodiment of the present disclosure is applied to a front windshield. FIG. 12 is a cross-sectional and enlarged schematic view of the transparent display device of FIG. 11. Please refer to FIG. 11 and FIG. 12. The first direction x and the second direction y are substantially parallel to the driving backplane BP and perpendicular to each other. The third direction z is substantially perpendicular to the first direction x and the second direction y. The geometric center C152 of the first opening 152 and the geometric center C172 of the second opening 172 are deviated in the second direction y. The vertical projection $A_{yz}$ of the connection line between the geometric center C152 of the first opening 152 and the geometric center C172 of the second opening 172 on a plane where the second direction y and the third direction z are located (i.e., the yz plane) is substantially overlapped with a vertical projection B1 of a connection line between the geometric center C172 of the second opening 172 and the user's eye E on the same plane (i.e., yz plane). That is to say, the second offset $y_3$ between the first opening 152 of the first light-shielding layer 150 and the second opening 172 of the second light-shielding layer 170 of the transparent display device 10B has been designed according to the optimal viewing angle $\theta_y$ in the second direction y.

Taking the application of the transparent display device 10B in the front windshield F as an example, the angle $\alpha$ between the front windshield F and the ground falls in the range of 30° to 40°, and the optimal viewing angle $\theta_y$ in the second direction y may fall within the range of 56° to 64°. By substituting the optimal viewing angle $\theta_y$ and other values into the aforementioned Relationship expression (2), the appropriate second offset $y_3$ between the first opening 152 and the second opening 172 in the second direction y may be designed. Similarly, taking the application of the transparent display device 10B in the front windshield F as an example, the optimal viewing angle $\theta_x$ parallel to the first direction x may fall in the range of −15° to 15°. By substituting the optimal viewing angle $\theta_x$ and other numerical values into the aforementioned Relationship expression (1), an appropriate first offset $x_3$ between the first opening 152 and the second opening 172 in the first direction x may be designed.

Figure 14:
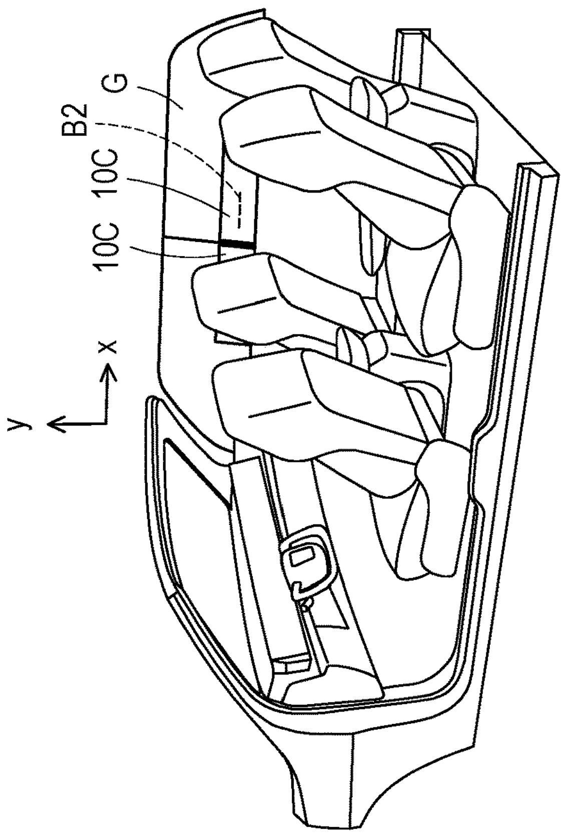
FIG. 14 shows a situation in which a transparent display device according to still another embodiment of the present disclosure is applied to a side window glass.
Figure 13:
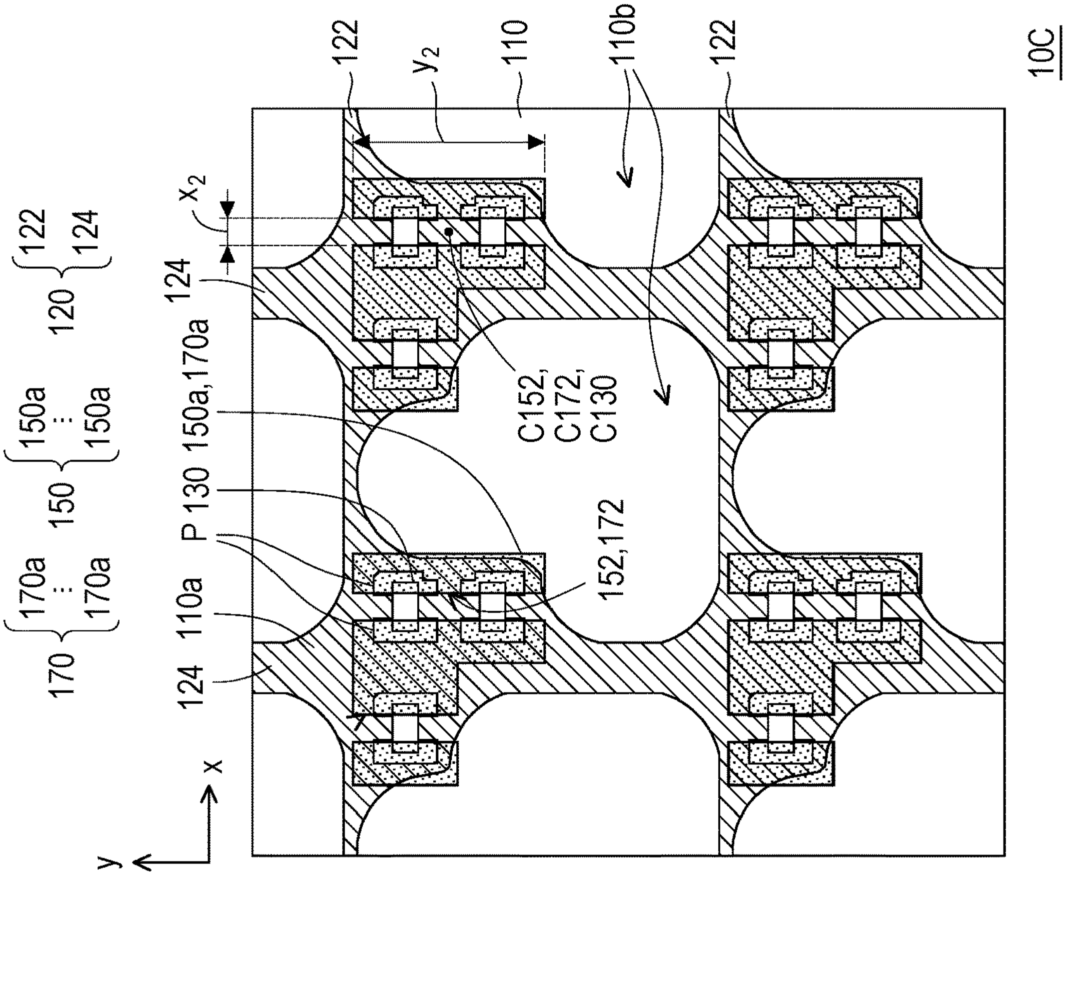
FIG. 13 is a schematic top view of a transparent display device according to yet another embodiment of the present disclosure.

FIG. 13 is a schematic top view of a transparent display device according to yet another embodiment of the present disclosure. FIG. 14 shows a situation in which a transparent display device according to still another embodiment of the present disclosure is applied to a side window glass. Please refer to FIG. 13 and FIG. 14. The transparent display device 10C of this embodiment is similar to the aforementioned transparent display device 10. The difference between the two is: the shapes of the first opening 152 of the first light-shielding layer 150 and the second opening 172 of the second light-shielding layer 170 of the transparent display device 10C of this embodiment are different from those of the first opening 152 of the first light-shielding layer 150 and the second opening 172 of the second light-shielding layer 170 of the transparent display device 10 of the previous embodiment.

Please refer to FIG. 13 and FIG. 14. Specifically, in this embodiment, the first direction x is a horizontal direction, the second direction y is perpendicular to the first direction x and parallel to the side window glass G, and the second opening width $y_2$ of the first opening 152 in the second direction y is greater than the first opening width $x_2$ of the first opening 152 in the first direction x. A vertical projection B2 of a connection line between the geometric center C152 of the first opening 152 and the eye (not shown) of a user sitting in the back seat/or passenger seat on the driving backplane BP located in the side window glass is staggered with the second direction y. In short, in this embodiment, the first opening 152 of the first light-shielding layer 150 may be a first elongated slit extending in the second direction y. Similarly, in this embodiment, the second opening 172 of the second light-shielding layer 170 may be a second elongated slit extending in the second direction y.

Figure 16:
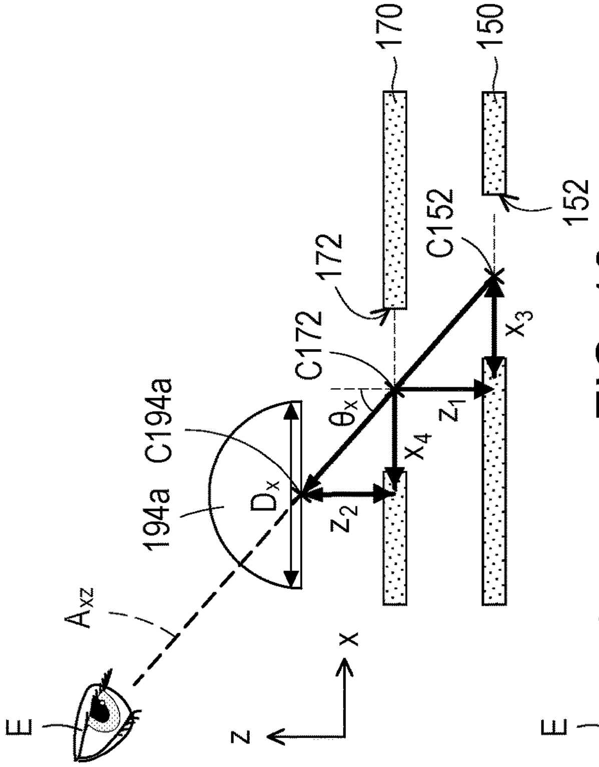
FIG. 16 is a cross-sectional and enlarged schematic view of the first light-shielding layer and the second light-shielding layer of the transparent display device according to an embodiment of the present disclosure.
Figure 17:
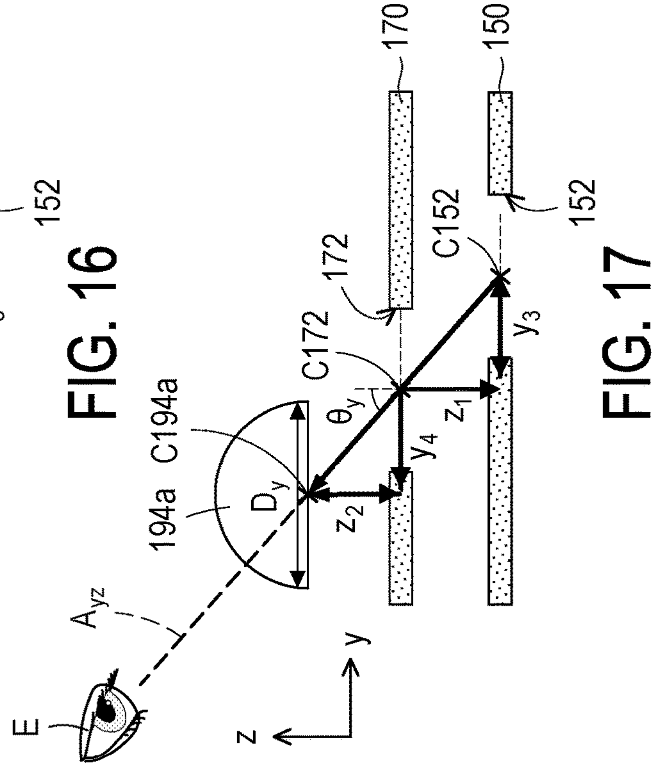
FIG. 17 is a cross-sectional and enlarged schematic view of the first light-shielding layer and the second light-shielding layer of a transparent display device according to another embodiment of the present disclosure.
Figure 15:
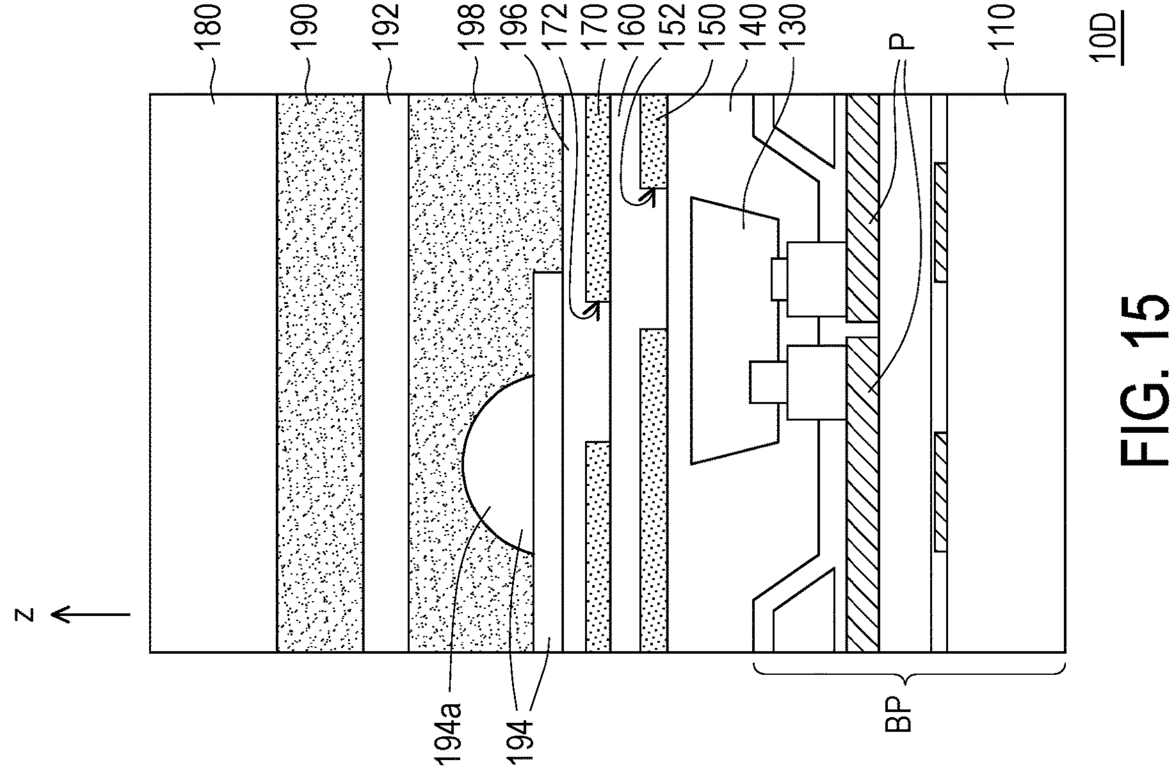
FIG. 15 is a schematic cross-sectional view of a transparent display device according to an embodiment of the present disclosure.

FIG. 15 is a schematic cross-sectional view of a transparent display device according to an embodiment of the present disclosure. FIG. 16 is a cross-sectional and enlarged schematic view of the first light-shielding layer and the second light-shielding layer of the transparent display device according to an embodiment of the present disclosure. FIG. 17 is a cross-sectional and enlarged schematic view of the first light-shielding layer and the second light-shielding layer of a transparent display device according to another embodiment of the present disclosure. FIG. 16 is a cross-section of the first light-shielding layer 150 and the second light-shielding layer 170 in the first direction x and the third direction z, and FIG. 17 is a cross-section of the first light-shielding layer 150 and the second light-shielding layer 170 in the second direction y and the third direction z.

Referring to FIG. 15, the transparent display device 10D of this embodiment is similar to the aforementioned transparent display device 10B. The main difference between the two is that the transparent display device 10D of this embodiment further includes a microlens layer 194, which is disposed between the optical clear adhesion 190 and the second light-shielding layer 170. Specifically, in this embodiment, the transparent display device 10D further includes a third planarization layer 196 covering the second light-shielding layer 170, and the microlens layer 194 is disposed on the third planarization layer 196 and may be connected to the molding layer 192 through another optical clear adhesion 198. The microlens layer 194 has a microlens 194*a*, and the microlens 194*a* at least partially overlap with the second opening 172 of the second light-shielding layer 170. In this embodiment, the offset between the second opening 152 of the first light-shielding layer 150 and the second opening 172 of the second light-shielding layer 170 combined with the offset between the microlens 194*a* of the microlens layer 194 and the second opening 172 of the second light-shielding layer 170 makes it possible to increase the light usage efficiency at the required viewing angle.

Please refer to FIG. 15 and FIG. 16. In this embodiment, the microlens layer 194 and the second light-shielding layer 170 have a vertical distance $z_2$ in the third direction z that is substantially perpendicular to the driving backplane BP. A geometric center C172 of the second opening 172 and a geometric center C194*a* of the microlens 194*a* have a first lens offset $x_4$ in the first direction x that is substantially parallel to the driving backplane BP and perpendicular to the third direction z. The microlens 194*a* has a first lens diameter $D_x$ in the first direction x, and the first lens offset $x_4$ satisfies:

$$z_2 \times \tan\theta_x - \frac{D_x}{2} < x_4 < z_2 \times \tan\theta_x + \frac{D_x}{2},$$

wherein $\theta_x$ is an angle between the vertical projection $A_{xz}$ of a connection line between the geometric center C172 of the second opening 172 and a user's eye E on the plane where the first direction x and the third direction z are located and the third direction z.

Please refer to FIG. 15 and FIG. 17. In this embodiment, the geometric center C172 of the second opening 172 and the geometric center C194*a* of the microlens 194*a* have a second lens offset $y_4$ in the second direction y that is substantially perpendicular to the third direction z and the first direction x. The microlens 194*a* has a second lens diameter $D_y$ in the second direction y, the second lens diameter $D_y$ is equal to the first lens diameter $D_x$ (shown in FIG. 16), and the second lens offset $y_4$ satisfies:

$$z_2 \times \tan\theta_y - \frac{D_y}{2} < y_4 < z_2 \times \tan\theta_y + \frac{D_y}{2},$$

wherein $\theta_y$ is an angle between the vertical projection $A_{yz}$ of a connection line between the geometric center C172 of the second opening 172 and a user's eye E on the plane where the second direction y and the third direction z are located and the third direction z.

Figure 18:
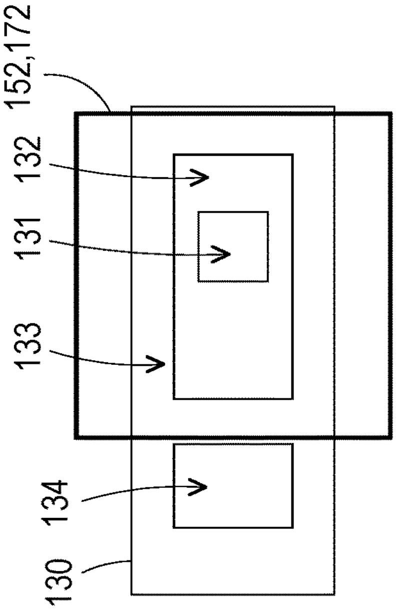
FIG. 18 is a schematic top view of the light-emitting element, the first opening and the second opening of the transparent display device according to yet another embodiment of the present disclosure.

FIG. 18 is a schematic top view of the light-emitting element, the first opening and the second opening of the transparent display device according to yet another embodiment of the present disclosure. In this embodiment, the first opening 152 and the second opening 172 may be in a square shape exceeding beyond the light-emitting element 130.

Figure 19:
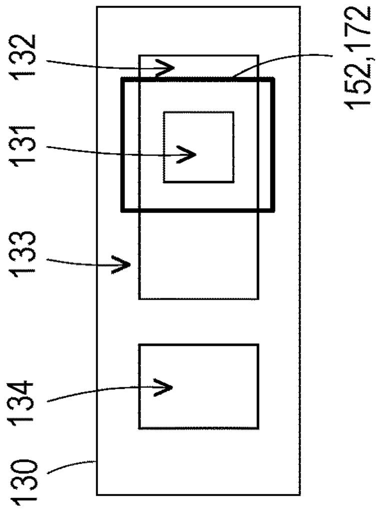
FIG. 19 is a schematic top view of the light-emitting element, the first opening and the second opening of the transparent display device according to still another embodiment of the present disclosure.

FIG. 19 is a schematic top view of the light-emitting element, the first opening and the second opening of the transparent display device according to still another embodiment of the present disclosure. In this embodiment, the first opening 152 and the second opening 172 may be in a square shape located within the light-emitting element 130.

Figure 20:
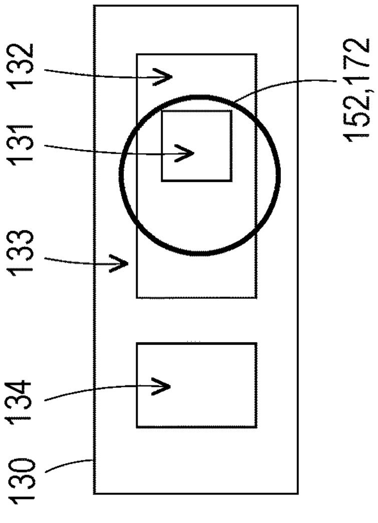
FIG. 20 is a schematic top view of the light-emitting element, the first opening and the second opening of the transparent display device according to yet another embodiment of the present disclosure.

FIG. 20 is a schematic top view of the light-emitting element, the first opening and the second opening of the transparent display device according to yet another embodiment of the present disclosure. In this embodiment, the first opening 152 and the second opening 172 may be circular.

Figure 21:
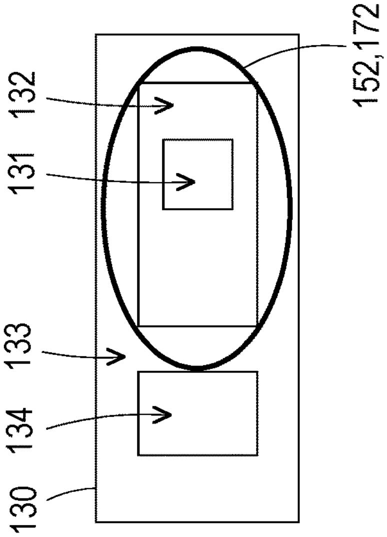
FIG. 21 is a schematic top view of the light-emitting element, the first opening and the second opening of the transparent display device according to an embodiment of the present disclosure.

FIG. 21 is a schematic top view of the light-emitting element, the first opening and the second opening of the transparent display device according to an embodiment of the present disclosure. In this embodiment, the first opening 152 and the second opening 172 may be horizontally elliptical.

Figure 22:
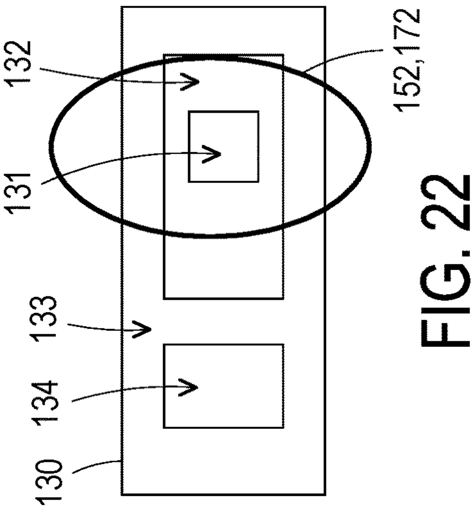
FIG. 22 is a schematic top view of the light-emitting element, the first opening and the second opening of the transparent display device according to still another embodiment of the present disclosure.

FIG. 22 is a schematic top view of the light-emitting element, the first opening and the second opening of the transparent display device according to still another embodiment of the present disclosure. In this embodiment, the first opening 152 and the second opening 172 may have a straight oval shape.

What is claimed is:

1. A transparent display device, comprising:

a driving backplane;

a light-emitting element disposed on the driving backplane and electrically connected to the driving backplane;

a first planarization layer disposed on the driving backplane and covering the light-emitting element;

a first light-shielding layer disposed on the first planarization layer and having a first opening, wherein the first opening at least partially overlaps the light-emitting element;

a second planarization layer covering the first light-shielding layer;

a second light-shielding layer disposed on the second planarization layer and having a second opening, wherein the second opening at least partially overlaps the first opening;

a molding substrate disposed on the second light-shielding layer; and an optical clear adhesion disposed between the molding substrate and the second light-shielding layer;

wherein the light-emitting element has a first light-emitting element width $x_1$ in a first direction, the first opening has a first opening width $x_2$ in the first direction, $$\frac{x_1}{2} < x_2 < \frac{3x_1}{2},$$

and the first direction is substantially parallel to the driving backplane.

2. The transparent display device according to claim 1, wherein in a top view of the transparent display device, a geometric center of the first opening of the first light-shielding layer is substantially aligned with a geometric center of the light-emitting element.

3. The transparent display device according to claim 1, wherein in a top view of the transparent display device, a geometric center of the first opening of the first light-shielding layer is substantially aligned with a luminous center of the light-emitting element, and the light-emitting element has a maximum luminous intensity at a position of the luminous center.

4. The transparent display device according to claim 1, wherein the first opening of the first light-shielding layer is substantially aligned with the second opening of the second light-shielding layer.

5. The transparent display device according to claim 1, wherein the first opening of the first light-shielding layer is staggered with the second opening of the second light-shielding layer, and the first opening of the first light-shielding layer partially overlaps with the second opening of the second light-shielding layer.

6. The transparent display device according to claim 1, wherein the light-emitting element has a second light-emitting element width $y_1$ in a second direction, the first opening has a second opening width $y_2$ in the second direction, $$\frac{y_1}{2} < y_2 < \frac{3y_1}{2},$$

and the second direction is substantially parallel to the driving backplane and perpendicular to the first direction.

7. The transparent display device according to claim 1, wherein the first light-shielding layer and the second light-shielding layer have a vertical distance $z_1$ in a third direction that is substantially perpendicular to the driving backplane, a geometric center of the first opening and a geometric center of the second opening have a first offset $x_3$ in the first direction that is substantially parallel to the driving backplane and perpendicular to the third direction, the first opening has the first opening width $x_2$ in the first direction, $$z_1 \times \tan\theta_x - \frac{x_2}{2} < x_3 < z_1 \times \tan\theta_x + \frac{x_2}{2},$$

and $\theta_x$ is an angle between a vertical projection of a connection line between the geometric center of the first opening and a user's eye on a plane where the first direction and the third direction are located and the third direction.

8. The transparent display device according to claim 7, wherein the geometric center of the first opening and the geometric center of the second opening have a second offset $y_3$ in a second direction that is substantially parallel to the driving backplane and perpendicular to the first direction, the first opening has a second opening width $y_2$ in the second direction, $$z_1 \times \tan\theta_y - \frac{y_2}{2} < y_3 < z_1 \times \tan\theta_y + \frac{y_2}{2},$$

$\theta_y$ is an angle between a vertical projection of the connection line between the geometric center of the first opening and the user's eye on a plane where the second direction and the third direction are located and the third direction.

9. The transparent display device according to claim 1, further comprising:

a microlens layer disposed between the optical clear adhesion and the second light-shielding layer, wherein the microlens layer has a microlens, and the microlens at least partially overlaps with the second opening of the second light-shielding layer.

10. The transparent display device according to claim 9, wherein the microlens layer and the second light-shielding layer have a vertical distance $z_2$ in a third direction that is substantially perpendicular to the driving backplane, a geometric center of the second opening and a geometric center of the microlens have a first lens offset $x_4$ in a first direction that is substantially parallel to the driving backplane and perpendicular to the third direction, the microlens has a first lens diameter $D_x$ in the first direction, $$z_2 \times \tan\theta_x - \frac{D_x}{2} < x_4 < z_2 \times \tan\theta_x + \frac{D_x}{2},$$

and $\theta_x$ is an angle between a vertical projection of a connection line between the geometric center of the second opening and a user's eye on a plane where the first direction and the third direction are located and the third direction.

11. The transparent display device according to claim 10, wherein the geometric center of the second opening and the geometric center of the microlens have a second lens offset $y_4$ in a second direction that is substantially perpendicular to the third direction and the first direction, the microlens has a second lens diameter $D_y$ in the second direction, $$z_2 \times \tan\theta_y - \frac{D_y}{2} < y_4 < z_2 \times \tan\theta_y + \frac{D_y}{2},$$

$\theta_y$ is an angle between a vertical projection of the connection line between the geometric center of the second opening and the user's eye on a plane where the second direction and the third direction are located and the third direction.

12. The transparent display device according to claim 1, wherein a first direction and a second direction are substantially parallel to the driving backplane, the first direction and the second direction are substantially perpendicular to each other, and a second opening width of the first opening in the second direction is greater than the first opening width of the first opening in the first direction, and a vertical projection of a connection line between a geometric center of the first opening and a user's eye on the driving backplane is staggered with the second direction.

13. The transparent display device according to claim 1, wherein a first direction and a second direction are substantially parallel to the driving backplane and perpendicular to each other, a third direction is substantially perpendicular to the first direction and the second direction, a geometric center of the first opening and a geometric center of the second opening are deviated in the second direction, and a vertical projection of a connection line between the geometric center of the first opening and the geometric center of the second opening on a plane where the second direction and the third direction are located is substantially overlapped with a vertical projection of a connection line between the geometric center of the second opening and a user's eye on the plane.

14. A transparent display device, comprising:

a driving backplane;

a light-emitting element disposed on the driving backplane and electrically connected to the driving backplane;

a first planarization layer disposed on the driving backplane and covering the light-emitting element;

a first light-shielding layer disposed on the first planarization layer and having a first opening, wherein the first opening at least partially overlaps the light-emitting element;

a second planarization layer covering the first light-shielding layer;

a second light-shielding layer disposed on the second planarization layer and having a second opening, wherein the second opening at least partially overlaps the first opening;

a molding substrate disposed on the second light-shielding layer; and an optical clear adhesion disposed between the molding substrate and the second light-shielding layer;

wherein the first opening of the first light-shielding layer is staggered with the second opening of the second light-shielding layer, and the first opening of the first light-shielding layer partially overlaps with the second opening of the second light-shielding layer.

15. The transparent display device according to claim 14, wherein in a top view of the transparent display device, a geometric center of the first opening of the first light-shielding layer is substantially aligned with a geometric center of the light-emitting element.

16. The transparent display device according to claim 14, wherein in a top view of the transparent display device, a geometric center of the first opening of the first light-shielding layer is substantially aligned with a luminous center of the light-emitting element, and the light-emitting element has a maximum luminous intensity at a position of the luminous center.

17. The transparent display device according to claim 14, wherein the first opening of the first light-shielding layer is substantially aligned with the second opening of the second light-shielding layer.

18. The transparent display device according to claim 14, wherein the first light-shielding layer and the second light-shielding layer have a vertical distance $z_1$ in a third direction that is substantially perpendicular to the driving backplane, a geometric center of the first opening and a geometric center of the second opening have a first offset $x_3$ in a first direction that is substantially parallel to the driving backplane and perpendicular to the third direction, the first opening has a first opening width $x_2$ in the first direction, $$z_1 \times \tan\theta_x - \frac{x_2}{2} < x_3 < z_1 \times \tan\theta_x + \frac{x_2}{2},$$

and $\theta_x$ is an angle between a vertical projection of a connection line between the geometric center of the first opening and a user's eye on a plane where the first direction and the third direction are located and the third direction.

19. The transparent display device according to claim 18, wherein the geometric center of the first opening and the geometric center of the second opening have a second offset $y_3$ in a second direction that is substantially parallel to the driving backplane and perpendicular to the first direction, the first opening has a second opening width $y_2$ in the second direction, $$z_1 \times \tan\theta_y - \frac{y_2}{2} < y_3 < z_1 \times \tan\theta_y + \frac{y_2}{2},$$

$\theta_y$ is an angle between a vertical projection of the connection line between the geometric center of the first opening and the user's eye on a plane where the second direction and the third direction are located and the third direction.

20. A transparent display device, comprising:

a driving backplane;

a light-emitting element disposed on the driving backplane and electrically connected to the driving backplane;

a first planarization layer disposed on the driving backplane and covering the light-emitting element;

a first light-shielding layer disposed on the first planarization layer and having a first opening, wherein the first opening at least partially overlaps the light-emitting element;

a second planarization layer covering the first light-shielding layer;

a second light-shielding layer disposed on the second planarization layer and having a second opening, wherein the second opening at least partially overlaps the first opening;

a molding substrate disposed on the second light-shielding layer;

an optical clear adhesion disposed between the molding substrate and the second light-shielding layer; and a microlens layer disposed between the optical clear adhesion and the second light-shielding layer, wherein the microlens layer has a microlens, and the microlens at least partially overlaps with the second opening of the second light-shielding layer.

* * * * *